US011617259B2

(12) United States Patent
Tuominen et al.

(10) Patent No.: US 11,617,259 B2
(45) Date of Patent: Mar. 28, 2023

(54) COMPONENT CARRIER WITH EMBEDDED COMPONENT EXPOSED BY BLIND HOLE

(71) Applicant: AT&S Austria Technologie & Systemtechnik Aktiengesellschaft, Leoben (AT)

(72) Inventors: Mikael Tuominen, Pernio (FI); Seok Kim Tay, Singapore (SG)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 17/248,502

(22) Filed: Jan. 27, 2021

(65) Prior Publication Data

US 2021/0243889 A1  Aug. 5, 2021

(30) Foreign Application Priority Data

Feb. 3, 2020  (CN) .......................... 202010078727.7

(51) Int. Cl.
| | |
|---|---|
| *H05K 1/09* | (2006.01) |
| *H05K 1/11* | (2006.01) |
| *H05K 1/16* | (2006.01) |
| *H05K 3/30* | (2006.01) |
| *H01L 23/13* | (2006.01) |
| *H01L 23/498* | (2006.01) |
| *H01L 23/522* | (2006.01) |

(Continued)

(52) U.S. Cl.
CPC .......... *H05K 1/0272* (2013.01); *H05K 1/0201* (2013.01); *H05K 1/0274* (2013.01); *H05K 3/0026* (2013.01); *H05K 3/0047* (2013.01); *H05K 2201/10121* (2013.01)

(58) Field of Classification Search
CPC ... H05K 1/09; H05K 1/11; H05K 1/16; H05K 1/115; H05K 1/185; H05K 1/188; H05K 1/0201; H05K 1/0203; H05K 1/0272; H05K 1/0274; H05K 3/30; H01L 23/13; H01L 23/498; H01L 23/522; H01L 27/146
USPC ............ 174/250, 260; 361/772; 29/837, 841
See application file for complete search history.

(56) References Cited

U.S. PATENT DOCUMENTS 6,674,017 B1   1/2004  Yamasaki et al.
8,914,974 B2 * 12/2014 Schrittwieser ......... H05K 1/188
29/841

(Continued)

FOREIGN PATENT DOCUMENTS

EP  3481162 A1  5/2019
KR  20080011832 A  2/2008

(Continued)

OTHER PUBLICATIONS

Le Meur, M.; Extended European Search Report in Application No. 21153438.3; pp. 1-7; dated Jul. 6, 2021; European Patent Office; 80298; Munich, Germany.

*Primary Examiner* — Xiaoliang Chen
(74) *Attorney, Agent, or Firm* — Robert A. Blaha; Smith Tempel Blaha LLC

(57) ABSTRACT

The present invention relates to an embedded printed circuit board including: an insulation substrate including a cavity; a sensor device disposed on the cavity; an insulating layer disposed on the insulation substrate, having an opening part exposing the sensor device; and a pad part disposed on the lower surface of the opening part exposing the sensor device.

18 Claims, 2 Drawing Sheets

(51) Int. Cl.
  *H01L 27/146* (2006.01)
  *H05K 1/02* (2006.01)
  *H05K 3/00* (2006.01)

(56) References Cited

U.S. PATENT DOCUMENTS

| | | | | |
|---|---|---|---|---|
| 9,171,854 B2* | 10/2015 | Kim | ............... | H01L 21/02532 |
| 10,283,680 B2* | 5/2019 | Langer | ............... | H01L 33/0095 |
| 2005/0146879 A1* | 7/2005 | Takahashi | ............ | H01L 33/505 |
| | | | | 257/E33.059 |
| 2005/0212091 A1 | 9/2005 | Usui et al. | | |
| 2009/0321118 A1* | 12/2009 | Kim | ............... | H01L 24/19 |
| | | | | 174/260 |
| 2011/0203107 A1* | 8/2011 | Schrittwieser | ......... | H01L 24/82 |
| | | | | 29/841 |
| 2011/0308849 A1* | 12/2011 | Kondo | ............... | H05K 3/0055 |
| | | | | 174/266 |
| 2012/0217606 A1* | 8/2012 | Itonaga | ............... | H01L 31/0203 |
| | | | | 438/66 |
| 2014/0346930 A1* | 11/2014 | Kohda | ............... | H01L 41/0533 |
| | | | | 216/41 |
| 2016/0056358 A1* | 2/2016 | Moosburger | ......... | H01L 33/647 |
| | | | | 438/22 |
| 2016/0143139 A1* | 5/2016 | Sorimachi | ............ | H01L 25/50 |
| | | | | 361/772 |
| 2018/0182796 A1* | 6/2018 | Tuominen | ......... | H01L 27/14627 |
| 2018/0310413 A1* | 10/2018 | Kasai | ............... | H01L 21/76807 |
| 2019/0006224 A1* | 1/2019 | Jang | ............... | H01L 24/97 |
| 2019/0179131 A1* | 6/2019 | Kasahara | ............... | G01B 9/02 |
| 2019/0186994 A1* | 6/2019 | Kasahara | ............... | G01J 3/26 |
| 2019/0265119 A1* | 8/2019 | Siegert | ............... | G01L 19/147 |
| 2019/0295944 A1* | 9/2019 | Kwon | ............... | H01L 21/568 |
| 2019/0326188 A1* | 10/2019 | Tuominen | ......... | H01L 23/49894 |
| 2019/0326339 A1* | 10/2019 | Dong | ............... | H01L 27/14636 |
| 2020/0044010 A1* | 2/2020 | Ju | ............... | H01L 27/3246 |
| 2020/0109047 A1* | 4/2020 | Tsuyutani | ............ | H04R 19/005 |
| 2020/0161199 A1* | 5/2020 | Tsuyutani | ................ | G01H 3/00 |
| 2020/0357838 A1* | 11/2020 | Fukuyama | ......... | H04N 5/2254 |
| 2020/0395396 A1* | 12/2020 | Yoo | ............... | H01L 27/14625 |
| 2021/0013180 A1* | 1/2021 | Seo | ............... | H01L 23/49816 |
| 2021/0063725 A1* | 3/2021 | Branigan | ............... | G02B 26/06 |
| 2022/0023645 A1* | 1/2022 | Deterre | ................ | A61N 1/375 |

FOREIGN PATENT DOCUMENTS

| | | |
|---|---|---|
| KR | 20150092840 A | 8/2015 |
| TW | 201807387 A | 3/2018 |

* cited by examiner

COMPONENT CARRIER WITH EMBEDDED COMPONENT EXPOSED BY BLIND HOLE

CROSS-REFERENCE TO RELATED APPLICATION

The present application claims the benefit of the filing date of Chinese Patent Application No. 202010078727.7, filed 3 Feb. 2020, the disclosure of which is hereby incorporated herein by reference.

TECHNICAL FIELD

Embodiments of the invention relate to a component carrier and to a method of manufacturing a component carrier.

Technological Background

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

Assembling a component on and/or in a component carrier with low effort and reliably maintaining the functionality of the component is still difficult.

SUMMARY

There may be a need to assemble a component of a component carrier in a simple and compact way while reliably ensuring a proper functionality of the component.

According to an exemplary embodiment of the invention, a method of manufacturing a component carrier is provided, wherein the method comprises providing a stack comprising at least one electrically conductive layer structure and/or at least one electrically insulating layer structure, embedding a component in the stack, creating (for example drilling) a blind hole in the stack towards (but preferably not entirely up to) the embedded component, and thereafter extending the blind hole (preferably up to the embedded component) by etching to thereby expose a surface portion of the embedded component.

According to another exemplary embodiment of the invention, a component carrier is provided, wherein the component carrier comprises a stack comprising at least one electrically conductive layer structure and/or at least one electrically insulating layer structure, a component embedded in the stack, and a blind hole in the stack exposing a surface portion of the embedded component and having at least partially curved sidewalls delimited by the stack.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "component" may particularly denote an inlay-type member. Such a component may be arranged in an interior of the stack. A component may in particular have an optical and/or electronic function. For instance, such a component may be a semiconductor die.

In the context of the present application, the term "blind hole" may particularly denote a hole in the stack which does not completely extend through the entire stack but ends in an interior of the stack with a closed bottom.

In the context of the present application, the term "partially curved sidewalls" may particularly denote that the sidewalls delimiting the blind hole do not have an entirely straight (i.e., vertical or slanted) shape, but may be bent and may thus show a non-zero curvature, at least along a subsection thereof. For instance, such a curved sidewall may comprise one or more concave and/or convex sections. It is however not excluded that a sub-portion of the sidewall also has a straight section, as long as it also has a curved section.

According to an exemplary embodiment of the invention, a component carrier (such as a printed circuit board) is provided having a preferably laminated (i.e., connected by pressure and/or heat) layer stack which includes an embedded component such as a sensor component. Access to said embedded component may be obtained by a combined blind hole creation (for instance drilling, preferably laser drilling) and etching process. According to an exemplary embodiment of the invention, an embedded package may thus be provided which can be manufactured with high quality and low effort, as well as with a compact configuration in view of the embedding. In contrast to conventional approaches, an exemplary embodiment creates an embedded (in particular optical sensor) package by (in particular lamination-based) encapsulation by formation of a layer stack, by removing stack material (for instance in a drilling procedure (preferably by soft laser drilling)) for forming a first portion of an access hole to the embedded component, and by subsequently exposing a surface portion of the embedded component (preferably in combination with cleaning an aperture window of the embedded component) by etching (in particular by a plasma treatment). Such a procedure can be carried out with low effort, while simultaneously reliably exposing a target surface portion of the embedded component without the risk of damage for the embedded component and in such a way that the exposed surface portion is reliably prevented from being covered by undesired residues, such as burnt stack material, dirt or dust. Advantageously, such a procedure can be carried out in a simple and quick way and may render conventionally used and undesired molding barriers, release layers, etc. dispensable. As a result of such a procedure (in particular when laser drilling is implemented), a blind hole may be formed in the stack which has at least partially curved sidewalls.

In the following, further exemplary embodiments of the method and the component carrier will be explained.

Drilling may be preferred for forming the blind hole. However, the blind hole may also be created by another process, for instance milling or cutting. Thus, a "drilling movement" of excavating material for creating a blind hole may be preferred, but optional. However, it may also be possible to use other techniques of opening up blind holes.

In an embodiment, the method comprises drilling the blind hole by laser drilling. A laser beam may be directed to the surface of the stack to thereby remove laminated stack material by the intense energy impact of the laser beam. The power of the laser beam, the irradiation time and the type of laser device used for the laser drilling may be adjusted in accordance with the target thickness of the blind hole to be drilled, the material of the stack, etc. Laser drilling has turned out as a powerful and quick method of creating the blind hole, even with small dimensions. Care should be taken that the laser drilling does not expose the above-mentioned surface portion of the embedded component, but maintains the embedded component covered with some remaining material of the stack. This may ensure that the sensitive surface portion of the embedded component is not deteriorated or even damaged by excessive laser energy. Laser processing for forming the blind hole may be carried out with a pulsed laser or with a continuous laser. It is possible to form the blind hole by a single laser shot or by a plurality of laser shots.

In an embodiment, the method comprises exposing the surface portion by plasma etching. Plasma etching may be denoted as a form of plasma processing used to process the component carrier. Plasma etching may involve a high-speed stream of plasma (such as glow discharge) of an appropriate gas mixture being shot (in particular in pulses) at the stack in which an access hole to the embedded component is to be formed. The plasma source or etch species can be electrically charged (i.e., may be provided in form of ions) or may be electrically neutral (for instance in form of atoms and/or radicals). During the plasma process, the plasma may generate volatile etch products from chemical reactions between the elements of the stack material to be etched and the reactive species generated by the plasma. Descriptively speaking, a plasma treatment of the stack with embedded component and blind hole may be carried out for removing a remaining thin film of laminated stack material still covering the embedded component after the above-described drilling process (in particular a laser drilling process, alternatively a mechanical drilling process). Since the plasma treatment may be less aggressive than a previous laser treatment for the sensitive surface of the component to be exposed, plasma etching is a highly advantageous process for actually exposing said surface portion of the embedded component. Simultaneously, said plasma treatment may also clean the surface of the embedded component, and optionally an aperture in the surface region thereof.

In an embodiment, the method comprises etching for extending the blind hole over the last few micrometers (in particular less than 5 μm) up to the embedded component. Thus, terminating said drilling (for instance by switching off the laser or stopping rotation of the mechanical drill bit) in due time before reaching the surface of the component to be exposed may ensure that the integrity of the component and its sensitive surface is maintained and is not negatively influenced by excessive laser energy or mechanical ablation by a drill bit. Thereafter, the remaining few micrometers of stack thickness, for instance a remaining distance in a range between 1 μm to 5 μm, may be removed by plasma etching to thereby expose the above-mentioned surface portion of the component.

In an embodiment, the method comprises etching for extending the blind hole over less than 5 μm up to the embedded component. Etching may be less efficient for removing dielectric stack material than laser drilling. Thus, the etching process can be limited to the last less than 5 μm coverage of the embedded component with dielectric stack material for ensuring a quick and efficient formation of the blind hole. At the same time, stopping (in particular laser) drilling should be controlled to occur early enough before the drilling process (for instance a laser beam) reaches the surface of the embedded component. The last micrometers should be removed by another process than drilling, preferably by etching, for protecting the embedded component from (in particular laser-caused) damage.

In an embodiment, the method comprises cleaning the exposed surface portion and/or the blind hole by said etching. Additionally or alternatively, the method may comprise cleaning the exposed surface portion and/or the blind hole by a laser treatment. In other words, the etching procedure and a laser treatment (for instance the same laser treatment used for drilling, or another laser treatment) may also clean the exposed surface portion and/or an interior of the blind hole from residues of the material removing procedure, dust, dirt and/or any other contamination. This may significantly improve the performance of the component carrier with embedded component, in particular for sensor applications, and more particularly for optical sensor applications, requiring a reliably exposed sensor-active surface.

In an embodiment, the component is an optical component, in particular an optical sensor, an optical emitter, a light-emitting device and/or an optically receiving and/or emitting device. For instance, the surface portion of the embedded optical component to be exposed may be a sensor-active surface of the optical sensor. In other words, said sensor-active surface may be capable of detecting electromagnetic radiation (such as optical light, infrared light, etc.) reaching the component from an environment. For instance, the optical component may be a photodiode or a camera (such as a CCD (charge coupled device) camera, or a CMOS (complementary metal oxide semiconductor) camera). In another embodiment, the optical component may be an electromagnetic radiation emitter, for instance a laser diode or a light-emitting diode. Reliably exposing an active surface portion (for instance a light-sensitive surface or a light-emitting surface) of such an optical component without the risk of damage may be highly advantageous for ensuring a proper functionality of the optical component.

In an embodiment, the component has an aperture at the exposed surface portion thereof. In particular, such an aperture may be a recess in a main surface of the embedded component corresponding to an optically active region of the optical component. In optics, an aperture may denote a hole or an opening through which light travels. More specifically, the aperture and focal length of an optical system may determine a cone angle of a bundle of rays that come to a focus in an image plane. The exposed surface portion of the optical component may include the entire aperture, and optionally additionally an annular region around said aperture.

In an embodiment, the component carrier comprises an optical element, in particular a lens, accommodated at least partially in the aperture. In other words, an optical element such as a lens with one or two curved surfaces (in particular with concave and/or convex curvature) may be mounted and accommodated at least partially in the aperture. Such an optical element may be provided for manipulating electromagnetic radiation such as light propagating between the embedded component and an environment of the component carrier in a predefined way.

In an embodiment, a width of the exposed portion of the embedded component is less than 100 μm, in particular less than 70 μm. Correspondingly, a maximum diameter of the blind hole may be in the same order of magnitude, for instance may be less than 150 μm, in particular less than 90 μm. Highly advantageously, even such small dimensioned exposed portions and corresponding blind holes can be created by laser drilling, followed by an etching of the last few micrometers up to the embedded component. Although mechanically drilling may be implemented in other embodiments of the invention, preferred embodiments of the invention from the blind hole by laser drilling, which renders the manufacturing process perfectly compatible with continued miniaturization of embedded components and active surface areas thereof.

In an embodiment, the at least partially curved sidewalls are at least partially concavely curved. In particular, concave means curving in or hollowed inward, as opposed to convex. Such a curved sidewall may result from laser drilling for forming the exterior major portion of the blind hole, which may be followed by a supplementary etching process for reaching the embedded component. In other words, a concavely curved sidewall may be considered as a fingerprint of a laser drilling process. The latter may be followed by an etching procedure for completing formation of the blind hole in a laminated layer stack of a component carrier extending up to an embedded component.

In an embodiment, the at least partially curved sidewalls have a curved section and a step at an interface with the component. More specifically, an exterior section (i.e., a section extending from an exterior surface of the stack) of the blind hole may have a curved (in particular concave) shape, whereas an interior section (i.e., a section directly next to the embedded component) of the blind hole may have a vertical and substantially straight shape. The exterior section may have a larger vertical extension than the interior section. Between the exterior section and the interior section, a step may be formed. Such a step between the described exterior section and the described interior section may be the result of a manufacture of a corresponding blind hole by laser drilling followed by plasma etching.

In an embodiment, the curved section is delimited by a first one of the at least one electrically insulating layer structure, in particular by a first electrically insulating material. The step may be delimited by a second one of the at least one electrically insulating layer structure, in particular by a second electrically insulating material being different from the first electrically insulating material. For instance, the first electrically insulating material of the first electrically insulating layer structure may be configured to be removable with a higher removal rate by laser drilling, whereas the second electrically insulating material of the second electrically insulating layer structure may be configured to be removable with a lower removal rate by laser drilling. In such an embodiment, the different materials of the respective electrically insulating layer structures themselves may define a stop position of the laser drilling. Preferably, the second electrically insulating material may be configured to be properly removable by etching, in particular by plasma etching, more preferably with a higher etching rate than that an etching rate of the first electrically insulating material. Hence, the selection of the dielectric materials may support the proper formation of the blind hole, as well as the protection of the embedded component against damage.

In an embodiment, the at least partially curved sidewalls taper towards the embedded component. For instance, the sidewalls may substantially conically taper inwardly, however with an overlying curvature. A tapering shape of the blind hole may result from the fact that the impact of the laser energy at an exterior surface of the stack may be stronger than at a more interior portion thereof.

In an embodiment, the exposed surface portion is a sensor-active surface of the component. A precise and reliable exposure of such a sensor-active surface is of utmost advantage for the functioning of the embedded component as a sensor with high signal-to-noise ratio.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imagable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film or photo-imagable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one component, which can be optionally surface mounted on and/or embedded in the stack, can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light-emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
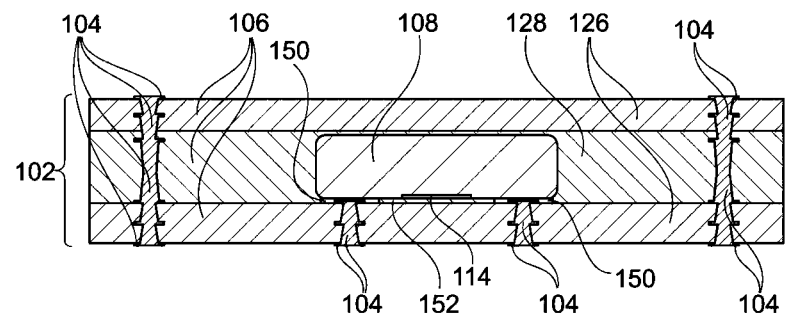
FIG. 1 illustrates a cross-sectional view of a preform of a component carrier during carrying out a method of manufacturing a component carrier according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

Conventionally, sensor packages are created utilizing a complex molded-package process flow with low robustness mechanical molding barriers for protecting a sensor aperture. Another conventional approach implements a release layer forming access to an encapsulated component.

An exemplary embodiment of the invention provides a manufacturing method for manufacturing component carriers with embedded or encapsulated component (in particular embedded sensor component), in which an aperture of the embedded component is accessed and cleaned by a laser and plasma process. Preferably, said encapsulation is accomplished by a lamination of multiple layer structures with the component in between. By a combined laser and plasma process, formation of an access blind hole for exposing the embedded component becomes possible without the need of cumbersome molding processes or release layers. Furthermore, such a manufacturing method may allow the creation of miniature access holes without the risk of damaging the sensitive embedded component. This may be accomplished by stopping a laser drilling process sufficiently early before reaching the embedded components, and by removing the remaining laminate material for finally exposing the embedded component by etching, for instance plasma etching.

According to exemplary embodiments of the invention, a sensor package manufacturing method may be provided which synergistically combines a laser cleaning process and a plasma cleaning process. This may ensure exposure of a functionally active surface portion of an embedded component, preferably in the framework of an embedded sensor package.

Exemplary embodiments of the invention provide a highly advantageous manufacturing architecture in which an embedded optical sensor package is created by encapsulation and by additionally forming and cleaning an aperture window by laser and plasma treatment. Such a manufacturing technology provides multiple benefits in terms of reliability and involves a significantly reduced manufacturing effort compared to the conventional concept of molding barriers. In particular, exemplary embodiments of the invention may allow to realize smaller opening dimensions without the need to form additional molding barriers or release layers.

Exemplary applications of exemplary embodiments of the invention are sensor packages (in particular optical sensor packages), cameras (for instance for mobile phones or automotive applications), light sources, and optoelectronic packages (for instance for optical data transmission).

Figure 2:
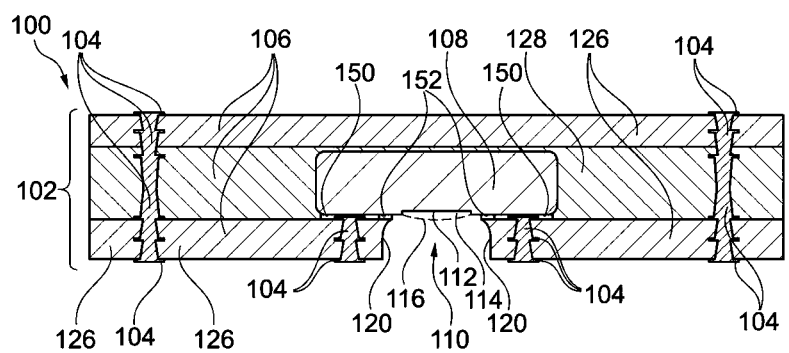
FIG. 2 illustrates a cross-sectional view of a component carrier according to an exemplary embodiment of the invention which may be obtained based on the preform shown in FIG. 1.

FIG. 1 illustrates a cross-sectional view of a preform of a component carrier 100 obtained during carrying out a method of manufacturing component carriers 100, as shown in FIG. 2, according to an exemplary embodiment of the invention.

As illustrated in FIG. 1, a component 108 is placed in a cavity (not shown) formed in a layer stack 102.

Stack 102 may be a plate-shaped laminate-type layer stack composed of a plurality of electrically conductive layer structures 104 and a plurality of electrically insulating layer structures 106. For example, the electrically conductive layer structures 104 may comprise patterned copper foils and vertical through connections, for example copper filled laser vias. The electrically insulating layer structures 106 may comprise a resin (such as epoxy resin) and optionally reinforcing particles therein (for instance glass fibers or glass spheres). For instance, the electrically insulating layer structures 106 may be made of FR4 or ABF. In the shown embodiment, the thick central electrically insulating layer structure 106 may be a fully cured core.

The above-mentioned cavity may be defined by a through-hole in the thick central electrically insulating layer structure 106 of the stack 102 which may be closed on a bottom side by attaching a temporary carrier (not shown) to a lower main surface of the core. The temporary carrier may for instance be a sticky tape. The component 108 with (here downwardly protruding) pads 150 may be attached with direct physical contact on the temporary carrier in the cavity. The function of the temporary carrier is to provide stability as long as the component 108 is not yet glued in place within the cavity.

The structure shown in FIG. 1 can be obtained by laminating one or more further electrically insulating layer structures 106 and one or more further electrically conductive layer structures 104 to the upper main surface of the central electrically insulating layer structure 106 accommodating component 108. For instance, a prepreg layer (as further electrically insulating layer structure 106) and one or more copper foils (as further electrically conductive layer structure 104) may be laminated on top. During the lamination process, uncured material of the further electrically insulating layer structure 106 may become flowable or melt and may flow in gaps between stack 102, temporary carrier and component 108. Upon curing (for instance cross-linking, polymerizing, etc.) of the material of the further electrically insulating layer structure 106, filling medium in said gaps may become solid. In particular, underfill 152 material may be formed in the gaps by said now solidified resin material.

As an alternative to the described lamination, it is also possible to glue component 108 in place in the cavity formed in stack 102 by filling liquid adhesive material in the gaps in between. Upon curing said adhesive material, the component 108 is again glued in place in cavity.

After having glued the component 108 in place within the cavity and thus having provided an integral connection with stack 102, the temporary carrier may be removed. When the temporary carrier is a sticky tape, it may be simply peeled off from the lower main surface of the structure shown in FIG. 1. One or more further electrically conductive layer structures 104 and electrically insulating layer structures 106 may be connected to the lower surface of the obtained structure to thereby obtain stack 102 as shown in FIG. 1.

By carrying out the described manufacturing process, the illustrated laminated stack 102 of electrically conductive layer structures 104 and electrically insulating layer structures 106 with embedded component 108 is obtained. In the shown embodiment, the embedded component 108 is an optical component, for instance an optical sensor configured for detecting visible light in an environment of the component carrier 100 been presently manufactured. For instance, the embedded component 108 is a photodiode or a camera. Hence, the described manufacturing method relates to a sensor embedding encapsulation using lamination technology. As can be taken from FIG. 1 as well, the bottom main surface of the component 108 has an aperture 114 in form of a recess. Within the aperture 114 at a bottom side of the component 108, a light-sensitive detection surface of the optical component 108 is located. Hence, a lower main surface of the embedded component 108 is provided with an aperture opening at which the sensor-active surface is located, which should be made accessible to the environment.

Figure 3:
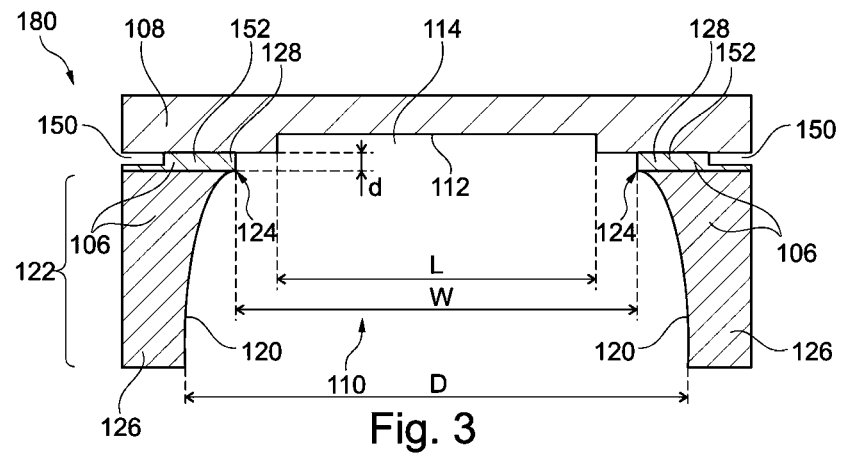
FIG. 3 illustrates a detail of the blind hole of the component carrier of FIG. 2.

FIG. 2 illustrates a cross-sectional view of a component carrier 100 according to an exemplary embodiment of the invention which may be obtained based on the preform described referring to FIG. 1 by carrying out the further manufacturing processes which will be described in the following. FIG. 3 illustrates a detail 180 of a blind hole 110 of the component carrier 100 of FIG. 2 which is created by said further manufacturing processes.

As shown in FIG. 2, blind hole 110 is created in the lower main surface of the stack 102. More specifically, said blind hole 110 extends from a bottom main surface of the structure shown in FIG. 1 towards the embedded component 108.

The major portion of the blind hole 110 from an exterior bottom main surface of the stack 102 through the lowermost electrically insulating layer structure 106 extends almost, but not entirely up to the component 108 and can be formed by laser drilling. By laser drilling, i.e., the irradiation of a central portion of the lower main surface of the stack 102 with a laser beam (not shown), dielectric material of the stack 102 may be efficiently removed with a high removal rate and thus quickly. Highly advantageously, the laser drilling process may stop at some distance (preferably a few micrometers) away from a surface portion 112 of the optical component 108 to be exposed. This may ensure that the sensor-active surface of the optical component 108, i.e., surface portion 112, is not reached by the laser beam and is therefore reliably protected from being deteriorated or damaged by excessive laser energy. By taking this measure, a rapid formation of the blind hole 110 may be combined with a reliable protection of the component 108 against damage.

Highly advantageously, laser drilling may be capable of creating a blind hole 110 with a small maximum width, D, of for instance 90 µm, see detail 180 of FIG. 3. As illustrated in FIG. 3 as well, a width, W, of the exposed portion 112 may be even smaller, for instance 60 µm. A width, L, of aperture 114 in a lower main surface of the component 108 may be still smaller, for instance 50 µm. Thus, the described manufacturing method is properly compatible with the trend of continuous miniaturization of embedded components 108 and corresponding component carriers 100.

After having completed the laser drilling procedure several micrometers away from the surface portion 112 to be exposed (and being presently still partially covered with dielectric material of stack 102), the method may continue by extending the already formed exterior portion of the blind hole 110 by etching further inwardly into the stack 102 to thereby expose the above-mentioned sensor-active surface portion 112 of the embedded component 108. Highly preferably, the method may comprise exposing the surface portion 112 by plasma etching. Alternatively, other etching procedures may be carried out (for instance wet etching with an etchant selected for maintaining surface portion 112 intact). Thus, the method may comprise etching for extending the blind hole 110 over the last few micrometers up to the embedded component 108 to thereby expose the latter. The extension of the blind hole 110 by etching may occur over less than 5 µm remaining up to the embedded component 108 after laser drilling. The thickness of the portion of the stack 102 removed by plasma etching is denoted in FIG. 3 with "d", wherein d may be for example in a range between 1 µm and 5 µm. Highly advantageously, the described plasma etching process completes the formation of the blind hole 110 up to the surface portion 112 of the embedded component 108 to be exposed.

Simultaneously, the etching process cleans the blind hole 110 and in particular the exposed bottom surface of the blind hole 110 delimited by the exposed surface portion 112. Also, a laser process may be used for supporting said cleaning. After laser drilling, residues of the laser-burnt dielectric material of the stack 102 may remain in the blind hole 110 and may disturb the sensor functionality of the embedded sensor component 108. However, exposing surface portion 112 may be synergistically and simultaneously combined with cleaning of the blind hole 110 by etching without damaging component 108. More specifically, cleaning the exposed surface portion 112 and/or the blind hole 110 may be accomplished by said etching process which exposes the exposed surface portion 112. Additionally or alternatively, an efficient cleaning of the exposed surface portion 112 and/or the blind hole 110 may be accomplished by laser treatment. Said laser treatment may be the same or an additional one as the one used for drilling the exterior portion of the blind hole 110. In particular the synergistic combination of plasma etching and laser processing for exposing and cleaning the exposed surface portion 112 and the blind hole 110 may be of utmost advantage.

As a result, the blind hole 110 in the stack 102 may be obtained with the shape as shown in FIG. 2 and FIG. 3. The blind hole 110 exposes surface portion 112 of the embedded component 108 and has partially curved sidewalls 120. In other words, the blind hole 110 is delimited by a sloped sidewall 120 of the stack 102.

More specifically, the partially curved sidewalls 120 are partially concavely curved. This is a consequence of laser drilling, since the laser beam has a stronger impact on the exterior of the stack 102 as compared to an interior thereof. More precisely, the partially curved sidewalls 120 have an exterior curved section 122 and an interior step 124 at an interface with the component 108. The formed step 124 is the consequence of the plasma etching. Furthermore, the partially curved sidewalls 120 taper towards the embedded component 108. This is as further consequence of the energy impact characteristic of the laser beam used for laser drilling the exterior main portion of the blind hole 110.

As shown in FIG. 3 as well, the curved section 122 is delimited by a first one of the electrically insulating layer structures 106, in particular by a first electrically insulating material 126 thereof. In contrast to this, the step 124 may be delimited by a second one of the electrically insulating layer structures 106, in particular by a second electrically insulating material 128 being different from the first electrically insulating material 126. By a corresponding material selection of the electrically insulating materials 126, 128, the characteristic shape of the blind hole 110 as shown in FIG. 2 may be further promoted. The shape of the blind hole 110 as shown in FIG. 2 is also highly advantageous for the sensor function of the embedded component 100, since its funnel-shape promotes propagation of light to be sensed between an exterior and an interior of the component carrier 100 while additionally providing a proper shielding against ambient light. Thus, the described geometry also promotes a high signal-to-noise ratio.

As shown as well in FIG. 2, the component carrier 100 may further comprise an optional optical element 116, such as a convex lens, which may for instance be accommodated partially or entirely in the aperture 114. Such an optical element 116 may further promote the optical performance of the sensor-package type component carrier 100.

In a nutshell, the manufacturing process is characterized by a laser ablation process with ultra-soft parameters followed by a plasma etch. As a result, the component carrier 100 with embedded and exposed component 108 is obtained being properly protected against damage and being configured for detecting light with high accuracy.

Figure 4:
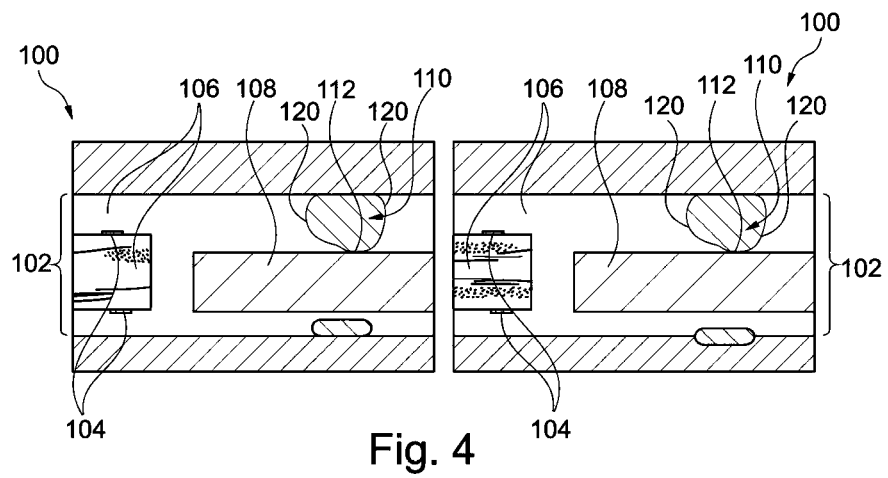
FIG. 4 illustrates images of component carriers manufactured according to exemplary embodiments of the invention.

FIG. 4 illustrates images of component carriers 100 manufactured according to exemplary embodiments of the invention.

The corresponding component carriers 100 have been manufactured by a process similar to that described referring to FIG. 1 to FIG. 3. Windows formed in the stack 102 by laser processing followed by plasma etching may have a width slightly above 100 µm.

Figure 5:
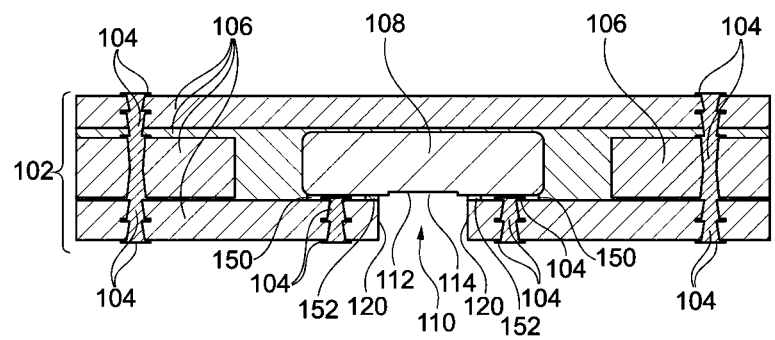
FIG. 5 illustrates a cross-sectional view of a component carrier according to another exemplary embodiment of the invention.

FIG. 5 illustrates a cross-sectional view of a component carrier 100 according to another exemplary embodiment of the invention.

The embodiment of FIG. 5 differs from the embodiment of FIG. 2 in particular in that the exterior portion of the blind hole 110 has a different shape in FIG. 5 as compared to FIG. 2. According to FIG. 5, the exterior portion of the blind hole 110 has straight walls as obtained for instance by mechanically drilling, for instance using a drill bit (not shown) for removing material of the stack 102. The mechanical drilling process may stop several micrometers (in particular between 1 µm and 5 µm) away from the surface portion 112 to be exposed. By such a stopping of the mechanically drilling process sufficiently remote from the surface portion 112 to be exposed, damage of the embedded component 108 during drilling can be reliably prevented. Thereafter, exposing the surface portion 112 as well as cleaning of the blind hole 110 may be accomplished by a subsequent etching process, preferably plasma etching.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A method of manufacturing a component carrier, comprising:
   providing a stack comprising at least one electrically conductive layer structure and at least one electrically insulating layer structure;
   embedding a component in the stack;
   creating a blind hole in the stack towards the embedded component; and
   thereafter extending the blind hole by etching to thereby expose a surface portion of the embedded component,
   wherein the blind hole has at least partially curved sidewalls with a curved section and a step at an interface with the component,
   wherein at least one of the curved section and the step is delimited by at least one of a first electrically insulating layer structure.

2. The method according to claim 1, wherein the method comprises drilling the blind hole by laser drilling.

3. The method according to claim 1, wherein the method comprises exposing the surface portion by plasma etching.

4. The method according to claim 1, wherein the method comprises carrying out the etching for extending the blind hole over the last few micrometers up to the embedded component.

5. The method according to claim 1, wherein the method comprises carrying out the etching for extending the blind hole over less than 5 µm up to the embedded component.

6. The method according to claim 1, wherein the method comprises cleaning the exposed surface portion and/or the blind hole by said etching.

7. The method according to claim 1, wherein the method comprises cleaning the exposed surface portion and/or the blind hole by a laser treatment.

8. A component carrier, comprising:
   a stack comprising at least one electrically conductive layer structure and at least one electrically insulating layer structure;
   a component embedded in the stack; and
   a blind hole in the stack exposing a surface portion of the embedded component and having at least partially curved sidewalls delimited by the stack,
   wherein the at least partially curved sidewalls have a curved section and a step at an interface with the component,
   wherein at least one of the curved section and the step is delimited by at least one of a first electrically insulating layer structure.

9. The component carrier according to claim 8, wherein the component is an optical component selected from the group consisting of an optical sensor, an optical emitter, a light-emitting device, and an optically receiving and/or emitting device.

10. The component carrier according to claim 8, wherein the component has an aperture at the exposed surface portion.

11. The component carrier according to claim 10, further comprising:

an optical element accommodated at least partially in the aperture.

12. The component carrier according to claim 8, wherein a width of the exposed surface portion is less than 100 μm.

13. The component carrier according to claim 8, wherein a maximum width of the blind hole is less than 150 μm.

14. The component carrier according to claim 8, wherein the at least partially curved sidewalls are at least partially concavely curved.

15. The component carrier according to claim 8, wherein the curved section is delimited by a first one of the at least one electrically insulating layer structure of a first electrically insulating material, and the step is delimited by a second one of the at least one electrically insulating layer structure of a second electrically insulating material being different from the first electrically insulating material.

16. The component carrier according to claim 8, wherein the at least partially curved sidewalls taper towards the embedded component.

17. The component carrier according to claim 8, wherein the exposed surface portion is a sensor-active surface of the component.

18. The component carrier according to claim 8, comprising at least one of the following features:

wherein the component is selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;

wherein the at least one electrically conductive layer structure comprises at least one of the group consisting of copper, aluminum, nickel, silver, gold, palladium, and tungsten;

wherein the at least one electrically insulating layer structure comprises at least one of the group consisting of reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;

wherein the component carrier is shaped as a plate;

wherein the component carrier is configured as one of the group consisting of a printed circuit board, and a substrate;

wherein the component carrier is configured as a laminate-type component carrier.

\* \* \* \* \*